United States Patent [19]
Berglund et al.

[11] Patent Number: 5,646,509
[45] Date of Patent: Jul. 8, 1997

[54] BATTERY CAPACITY TEST AND ELECTRONIC SYSTEM UTILIZING SAME

[75] Inventors: Neil C. Berglund, Kasson; Todd J. Rosedahl, Zumbrota; Steven W. Steele, Rochester, all of Minn.

[73] Assignee: International Business Machines Corporation, Armonk, N.Y.

[21] Appl. No.: 565,873

[22] Filed: Dec. 1, 1995

[51] Int. Cl.⁶ .......................... H01M 10/44; H02J 7/00; H02J 9/04; G01N 27/416
[52] U.S. Cl. .................. 320/48; 320/22; 307/66; 324/433
[58] Field of Search .................. 320/13, 22, 39, 320/48; 307/34, 46, 48, 64, 66, 85, 86, 87; 324/432, 433; 364/707

[56] References Cited

U.S. PATENT DOCUMENTS

| | | | |
|---|---|---|---|
| 3,593,099 | 7/1971 | Scholl . | |
| 4,845,419 | 7/1989 | Hacker | 320/39 |
| 4,972,181 | 11/1990 | Fiene . | |
| 5,057,697 | 10/1991 | Hammond et al. | 307/66 |
| 5,250,904 | 10/1993 | Salander et al. . | |
| 5,295,078 | 3/1994 | Stich et al. | 364/483 |
| 5,416,726 | 5/1995 | Garcia-Duarte et al. | 364/550 |
| 5,458,991 | 10/1995 | Severinsky | 307/66 X |
| 5,528,149 | 6/1996 | Chen | 324/433 |
| 5,583,440 | 12/1996 | Bisher | 320/48 X |

OTHER PUBLICATIONS

Berglund et al., "High Power Discharge Capacity Test for Lead Acid Batteries", IBM Technical Disclosure Bulletin (unpublished).

*Primary Examiner*—Peter S. Wong
*Assistant Examiner*—Patrick B. Law
*Attorney, Agent, or Firm*—Merchant Gould Smith Edell Welter & Schmidt

[57] ABSTRACT

A battery capacity test and electronic system implementing the same tests both the high and low discharge capacities of a back-up battery to ensure that the battery is capable of handling both a short term, high discharge load and a long term, low discharge load. The battery capacity test is particularly suitable for use in an electronic system which, upon occurrence of a power outage, converts from an operational mode to a power saving mode during a conversion time. High discharge capacity testing is performed using a "safety net" where the primary power source of the electronic system is switched to a reduced testing voltage output, rather than shut off or disconnected, so that the primary power source can take over quickly in the event of a back-up power supply failure during the test.

20 Claims, 7 Drawing Sheets

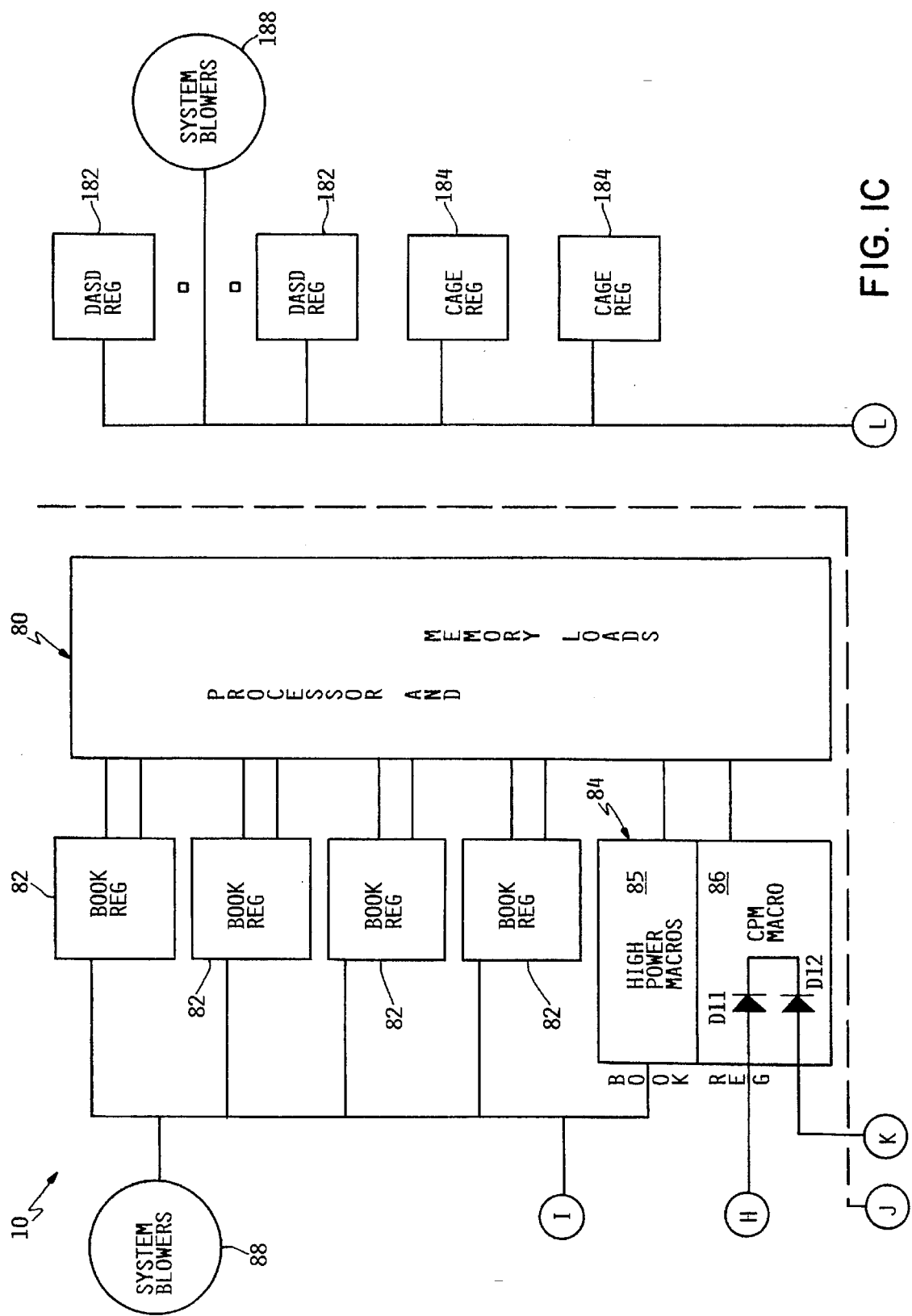
FIG. IC

LOW DISCHARGE
CAPACITY TEST

5,646,509

BATTERY CAPACITY TEST AND ELECTRONIC SYSTEM UTILIZING SAME

FIELD OF THE INVENTION

The invention relates to a battery capacity test and an electronic system utilizing the same. More particularly, the invention relates to a battery capacity test for a back-up or uninterruptable power supply in a high end computer system.

BACKGROUND OF THE INVENTION

Back-up, or uninterruptable, power supplies have numerous uses in electronics applications to provide a back-up power source to a primary power system, such as AC line power or a primary battery system. One use for such systems is in high end computer applications, such as mainframes, minicomputers, supercomputers, network servers, and the like to prevent data loss during an interruption of the primary power to the computer.

For example, the AS/400 minicomputer system manufactured by International Business Machines Corp. includes an internal back-up power supply incorporated into a System Power Control Network (SPCN). The back-up power supply is required to provide back-up power suitable for permitting the system to download or store critical memory such that IPL time is significantly shortened after power is restored to the system.

Typically, as a result of an outage, critical operations are completed during a "conversion time" before a low power "sleep" or power saving mode is instituted. A back-up power supply must operate at a higher output during the conversion time, and at a lower output in the power saving mode.

It is important to test the batteries of a back-up power supply periodically to ensure their capability to handle a power outage sufficiently. Testing requires that the batteries be discharged so that performance data can be obtained therefrom. Conventionally, testing occurs either by using a dummy load or by switching the system load to the back-up power supply to increase the rate of discharge and thereby reduce testing time.

However, we have found that batteries have both high and low discharge capacities, both of which may vary independently from one another over time. In some instances, batteries may be able to handle high discharge during a conversion time, but may not be able to handle a long term low discharge in a "sleep" mode, or vice versa. Thus, we have found that a substantial need has arisen for testing both the high and low power capacities of batteries to ensure they can handle both high power backup and low power "sleep" modes.

Another concern associated with battery capacity testing is that such tests must execute in a reasonable amount of time to maximize system availability. Many conventional tests shut down line power to a system and run the system off the backup batteries to speed up battery discharge.

However, shutting down line power and relying completely on the batteries to supply system load during testing poses a significant concern as to system integrity should the batteries or any other back-up power supply components fail during the test. Thus, a substantial need has also arisen for a battery capacity test and system implementing the same which operates quickly but without compromising system integrity.

SUMMARY OF THE INVENTION

The invention addresses these and other problems associated with the prior art in providing a battery capacity test and electronic system implementing the same in which both the high and low discharge capacities of back-up batteries are tested to ensure that the batteries are capable of handling the short term, high discharge load during a conversion time of the system, as well as a long term, low discharge load during a power saving mode. Moreover, preferred embodiments of the invention also address additional problems associated with the prior art in providing an electronic system which provides a "safety net" during battery testing where the primary power source is switched to a reduced voltage output, rather than shut off or disconnected, so that the primary power source can take over quickly in the event of a back-up power supply failure during a battery test.

Therefore, in accordance with one aspect of the invention, a method is provided for testing a battery in a back-up power supply of an electronic system of the type operating in a first, operational mode and a second, power saving mode, and the electronic system having a primary power source for providing power to the electronic system. The method includes the steps of testing a high discharge capacity for the battery to determine whether the battery is capable of supplying sufficient power to the electronic system during a conversion time in which the electronic system converts from the operational mode to the power saving mode; and testing a low discharge capacity for the battery to determine whether the battery is capable of supplying sufficient power to the electronic system during the power saving mode.

In accordance with another aspect of the invention, an electronic system is provided of the type operating in a first, operational mode and a second, power saving mode. The electronic system includes a primary power source for providing power over a system bus; a back-up power supply coupled to the system bus for providing power over the system bus when the primary power source is not operating, the back-up power supply including a battery; and a controller for testing the battery. The controller includes high discharge capacity testing means for testing a high discharge capacity of the battery to determine whether the battery is capable of supplying sufficient power to the electronic system during a conversion time in which the electronic system converts from the operational mode to the power saving mode; and low discharge capacity testing means for testing a low discharge capacity of the battery to determine whether the battery is capable of supplying sufficient power to the electronic system during the power saving mode.

In accordance with an additional aspect of the invention, a program storage device is provided which is readable by an electronic system of the type operating in a first, operational mode and a second, power saving mode. The electronic system has a primary power source for providing power to the electronic system, and the program storage device tangibly embodies a program of instructions executable by the electronic system to perform a method of testing a battery in a back-up power supply coupled to the electronic system. The method includes the steps of testing a high discharge capacity for the battery to determine whether the battery is capable of supplying sufficient power to the electronic system during a conversion time in which the electronic system converts from the operational mode to the power saving mode; and testing a low discharge capacity for the battery to determine whether the battery is capable of supplying sufficient power to the electronic system during the power saving mode.

These and other advantages and features, which characterize the invention, are set forth in the claims annexed hereto and forming a further part hereof. However, for a better understanding of the invention, and of the advantages and objectives attained by its use, reference should be made to the Drawing, and to the accompanying descriptive matter, in which there are described preferred embodiments of the invention.

DETAILED DESCRIPTION OF THE PREFERRED EMBODIMENTS

Figure 1A:
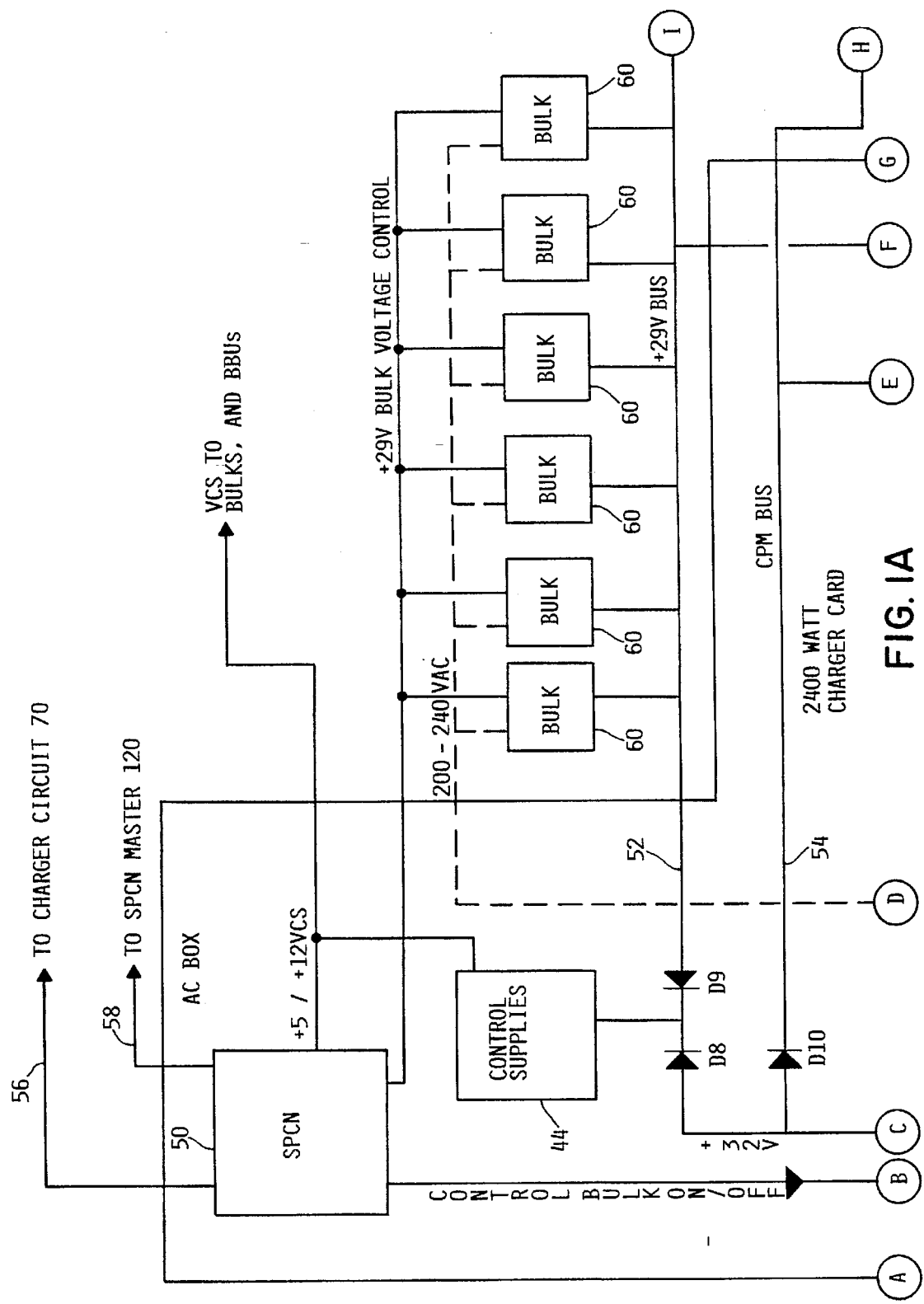
FIG. 1 is a block diagram illustrating the primary components in a system power control network of a preferred electronic system consistent with the principles of the invention.
Figure 1B:
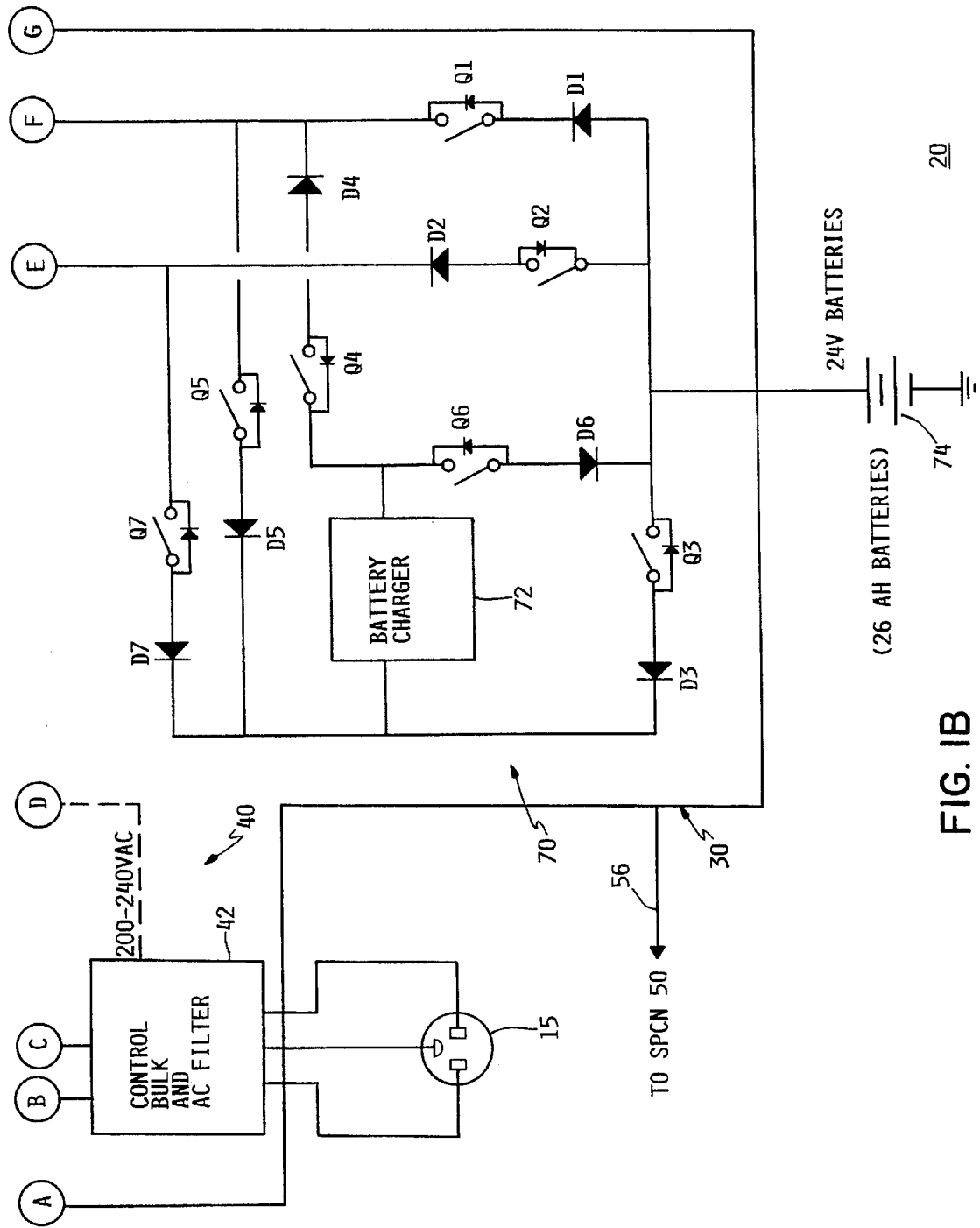
Figure 1D:
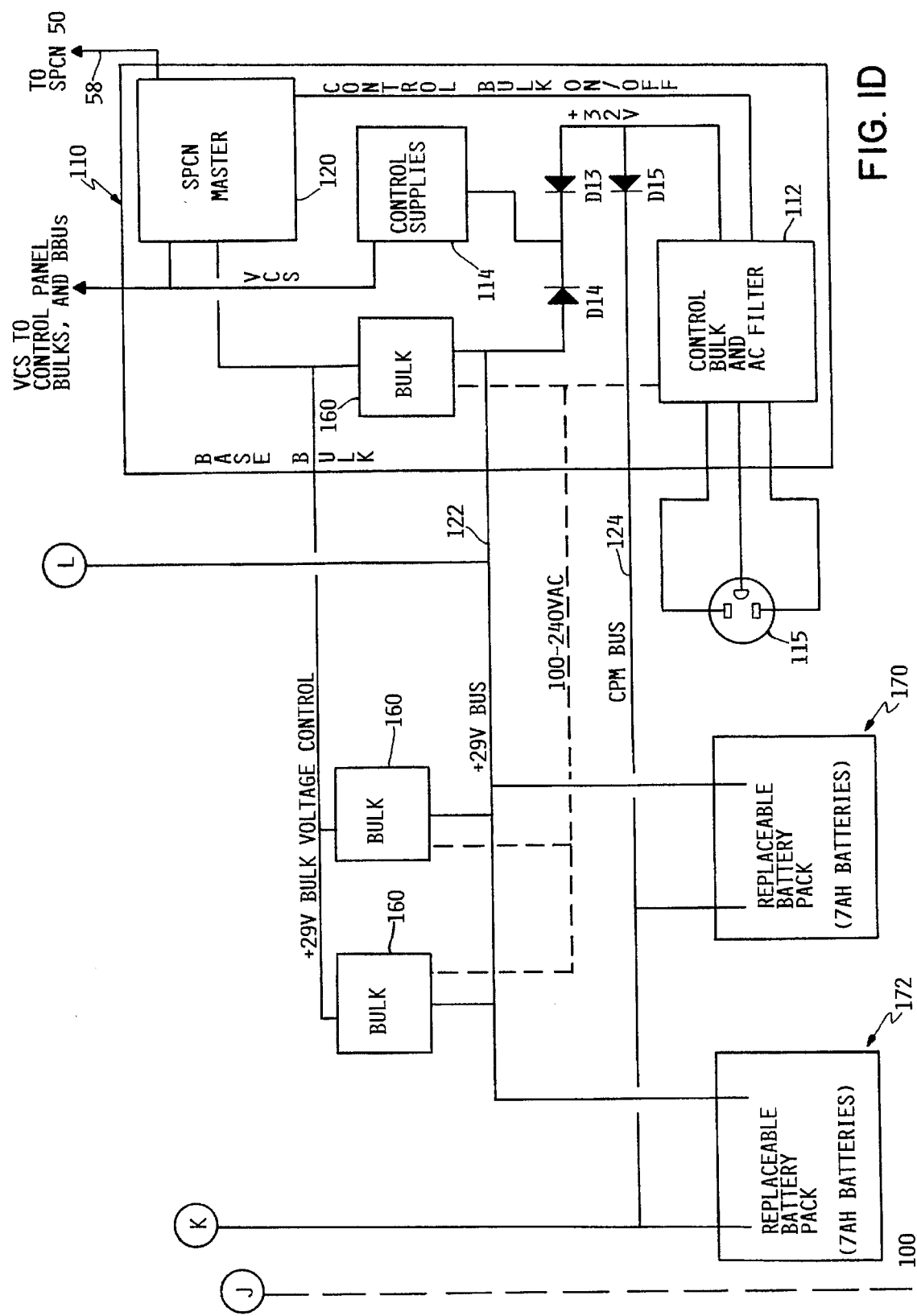
Figure 2A:
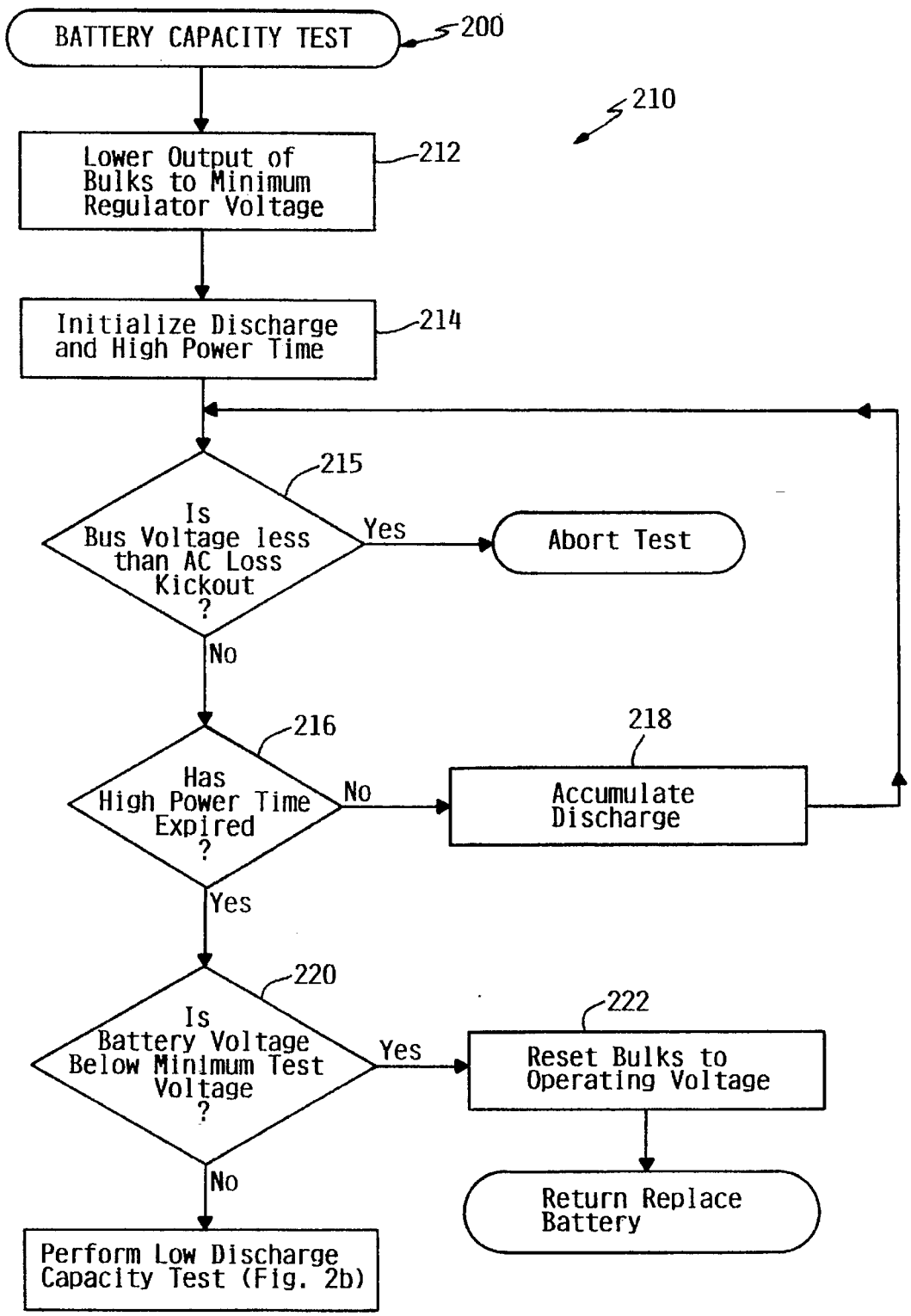
FIGS. 2a and 2b are flowcharts illustrating the primary steps in a preferred battery capacity test routine executed on the electronic system of FIG. 1.
Figures 1, 2B:
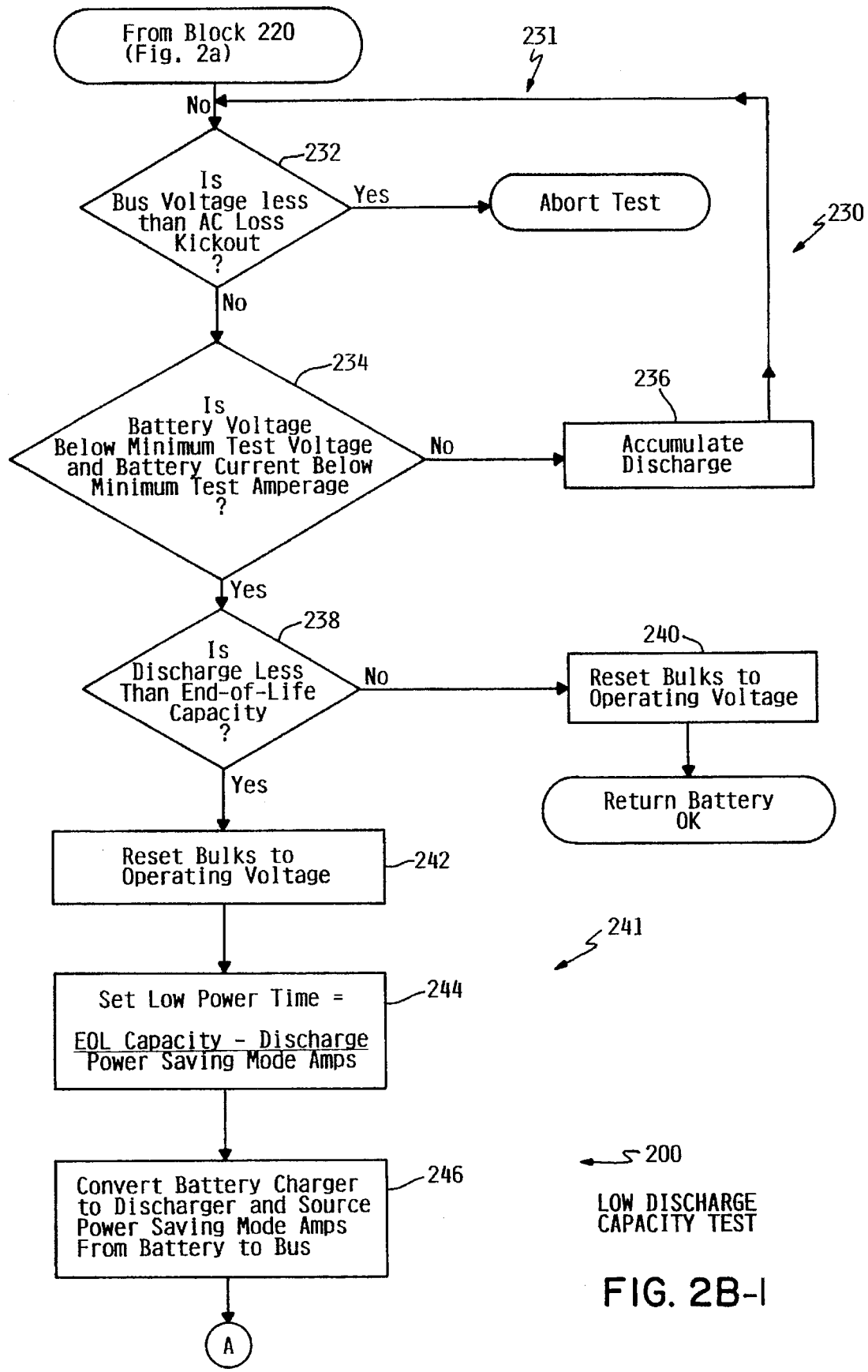
Figures 2, 2B:
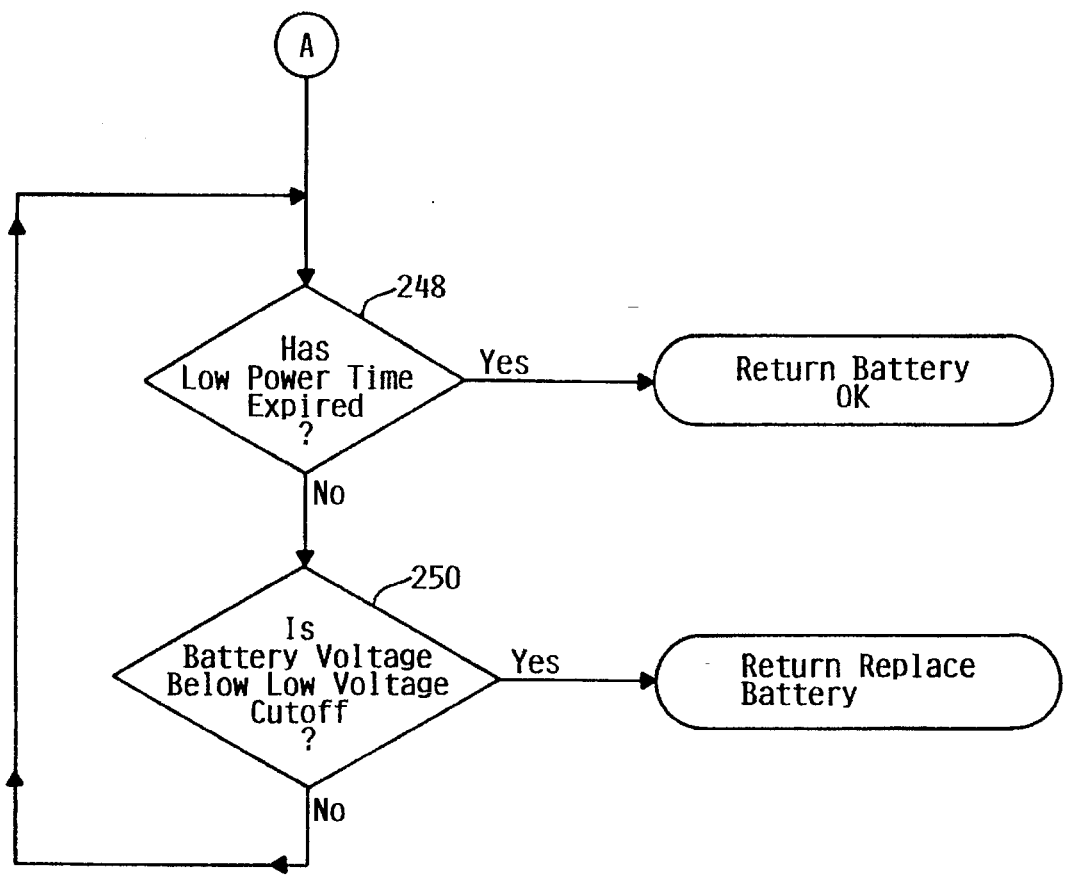

Turning to the Drawing, FIG. 1 shows a preferred electronic system 10 which executes a preferred battery capacity test routine consistent with the invention. In the preferred embodiment, electronic system 10 is an AS/400 computer system Model 530 manufactured by IBM. However, it will be readily appreciated that the principles of the invention may apply to other computer applications, such as other mainframes, minicomputers, network servers, supercomputers, personal computers, workstations, etc., as well as other electronics applications where battery power is supplied either as a primary or back-up source of power for the application. Therefore, while the discussion herein focuses on a particular IBM AS/400 application, the invention should not be limited to the particular hardware or software designs, performance and testing parameters, or application-specific functions disclosed herein.

Electronic System Hardware Components

Turning to FIG. 1, electronic system 10 is preferably an AS/400 system broken into two subsystems 20 and 100, with subsystem 20 housing the processors and memory for the system, and subsystem 100 primarily housing input/output (I/O) functions, as well as additional support and peripheral functions. Some systems, including some AS/400 systems, are not broken into separate subsystems, and thus much of the duplicative functionality provided in the separate subsystems herein may not be required for these alternative systems.

The function of subsystem 20 is generally illustrated in FIG. 1, with the processor and memory functions shown functionally by block 80 merely as a load on the system power control network. Block 80 is driven by a primary bus 52 which preferably provides a high wattage (about 2400 W)+29 VDC source of power. A supplemental, continuously powered memory (CPM) bus 54 also drives block 80 during a low power sleep mode of the system (discussed below).

An AC Box 30 includes a control block 40 and a back-up power supply block 70. Control block 40 includes a system power control network (SPCN) controller 50, which is preferably a microprocessor-based power control card. The control block and a bank of bulks 60 form the primary power source for subsystem 20.

SPCN controller 50 generally oversees power distribution in subsystem 20, handles power outages, keeps the batteries charged and performs routine battery capacity and other diagnostic testing. Controller 50 is preferably run by an 8XC51A microprocessor, and includes one or more program storage devices for storing the routines which implement the preferred battery capacity tests consistent with the invention.

By "program storage device", what is meant is any device or apparatus capable of storing information such as data or program code either in a volatile or non-volatile manner, including memory devices such as RAMs, ROMs, EPROMs, processor and cache memories, flash memories, etc.; as well as fixed or removable mass storage medias such as magnetic disks (fixed or removable), CD-ROMs, magnetic tape, etc. In the preferred controller 50, the battery capacity test routines are resident in non-volatile memory devices such as programmable ROMs.

It will be appreciated that other control circuitry may be used in alternative, e.g., by implementing the control circuitry through the use of logic gates, programmable logic devices, or other hardware components in lieu of a microprocessor-based system. It will also be appreciated that many of the specific programming, functions and particular protocols used to communicate with other components in the electronic system are conventional and thus need not be discussed in greater detail herein.

A control bulk and AC filter block 42 is controlled by SPCN controller 50. Block 42 provides a filtered AC output to drive a bank of bulks 60 which drive primary bus 52. Block 42 also provides a +32 VDC output through diode D10 to bus 54 and diode D8 connected to drive control supplies 44 which preferably output +5 and +12 VDC signals to power controller 50, as well as additional components (not shown). In addition, a reversed bias diode D9 isolates block 42 from the primary bus 52. Any known AC filters and power supplies and regulators may be used to provide these functions consistent with the invention.

A back-up power supply block 70 provides an uninterruptable source of power from batteries 74 in the event of line power outages. A battery charging circuit 72 therein includes the necessary regulation and switching circuitry for charging and discharging, or sourcing from, batteries 74. Circuit 72 also includes current and voltage sensing circuitry to output data related to the battery current output, the battery voltage output, and the voltage on bus 52 when polled by SPCN controller 50 over a serial interface 56. Any suitable battery charging/discharging circuitry may be used to implement block 70, e.g., as shown in U.S. patent application Ser. No. 08/531,466 filed on Sep. 21, 1995 by Steven W. Steele et al. (IBM Docket No. RO995-079), which is incorporated by reference herein.

Batteries 74 are preferably a pair of sealed lead-acid batteries mounted in a fixed unit that is not readily replaced by a user. Each battery is preferably a 12 Volt, 1200 W model having a capacity of 26 Amp-hours (AH), e.g., Genesis G12V120W15SP batteries manufactured by Hawker Energy Products. However, it will be appreciated that various other sizes, types, and capacities of batteries may also be used in the alternative depending upon a particular system's needs.

Batteries 74 are coupled to buses 52, 54 through a series of diodes D1-D7 and switches Q1-Q7 (discussed below). Switches Q1-Q7, as well as circuit 72, are accessed by SPCN controller 50 through serial interface line 56. The specific connections not shown for clarity of illustration, and moreover, the specific protocol used therein is not discussed as it is not necessary for an understanding of the invention. It will also be appreciated that other back-up or uninterruptable power supply designs may be used in the alternative.

A bank of bulks 60, operating as AC/DC converters and voltage regulators, drive primary bus 52. Each bulk (also referred to herein as a "regulator") is preferably a modular power supply, and in the preferred embodiments the bulks are each capable of converting 200–240 VAC (or alternatively 100–120 VAC, depending upon the line power used), to +29 VDC at 500 W. Bulks 60 drive a plurality of DC/DC converters, e.g., book regulators 82 and 84, using bus 52. Bulks 60 also drive system blowers 88 to provide internal cooling.

Bulks 60 receive the filtered AC signal from block 42 and are each controlled by SPCN controller 50 to output (or regulate) at either a full power operating voltage (+29 VDC) or at a reduced testing voltage, preferably a minimum regulator voltage (+21.5 VDC) which is below the full capacity voltage of the back-up power supply, such that when the outputs of the bulks are reduced, the backup power supply primarily drives bus 52. This provides a "safety net" to quickly recover in the event of a back-up power supply failure during testing. Preferably, six such bulks drive bus 52. An example of a bulk which may be configured in this fashion is the No. 87G6110 500 W bulk available from IBM, although any alternate number and/or sizes of regulators and converters may be used depending upon system power requirements.

As discussed above, the system load represented by block 80 is coupled to buses 52 and 54 through a plurality of DC/DC converters or regulators 82, 84 which convert the voltage outputs on the buses to different output voltages as needed. Book Regulators 82 shown in FIG. 1 each provide different DC output voltages as required by system 10. The number and levels of DC outputs vary based upon system requirements.

An additional book regulator is illustrated at 84, and which includes a pair of DC/DC converters 85, 86 coupled respectively to buses 52, 54. The first converter is a high power macro which provides a +3.6 VDC output at 360 W whenever bus 52 is powered, i.e., during normal operation of the system. The second is a CPM macro 86 which provides a 3.6 VDC output at 5.5 W during the low power "sleep" mode to maintain the backup memory in the system. Macro 86 receives CPM bus 54 through a diode D11, as well as a second CPM bus 124 in subsystem 100 through diode D12, which provides additional power so that subsystems 20 and 100 share load during low power mode.

In general, it will be appreciated that various modifications may be made to the hardware components of subsystem 20 consistent with invention. For example, other system power control network designs, primary power source designs, back-up power supply designs, etc. may be used. As a general rule, however, many of the considerations in these designs are dictated by the system power requirements of the particular electronic system at issue.

Subsystem 100 is substantially similar to subsystem 20, except that this subsystem has lower power requirements due to a lower overall system load. Subsystem 100 includes primary and CPM buses 122, 124; however, no continuously powered memory is used in the preferred embodiment, so the CPM bus supplies additional power to subsystem 20 through diode D12 to CPM macro 86. Primary bus 124 preferably drives three bulks 160, which preferably operate as dual output regulators similar to bulks 60, and which preferably provide at least 800 W of power to handle the system load of subsystem 100. The outputs of these bulks drive system blowers 188, as well as various DC/DC converters, e.g., regulators 182 and 184, to provide the various voltage levels required by the subsystem.

A control box 110 utilizes an SPCN master controller 120 which communicates with SPCN controller 50 over a serial interface line 58. Both controllers operate in a similar manner; however, because subsystem 100 includes a service processor and display panel (not shown), controller 120 has the responsibility to notify the service processor when either SPCN controller determines that one or more batteries need to be replaced. Controllers 50 and 120 are substantially independent of one another; however, they preferably may pass controls and system data between one another, e.g., to determine battery status, initiate tests, coordinate power-up/initialization operations, etc.

The primary components of subsystem 100 operate in a similar manner to the corresponding components in subsystem 20. For example, control box 110 includes a control bulk and AC filter block 112, which receives line power from connector 115 and provides a filtered AC output and a +32 VDC output. The DC output of this block is coupled to CPM bus 124 through diode D15 and a control supplies block 114 through diode D13. The DC output is isolated from primary bus 122 by diode D14 In addition, a pair of back-up power supplies 170, 172 are coupled to buses 122, 124 to provide a similar function as back-up power supply 70. These power supplies are preferably of the type disclosed in the aforementioned U.S. patent application Ser. No. 08/531,466. Supplies 170, 172 each include a customer replaceable battery pack with two 12 Volt/7 Amp-hour sealed lead acid batteries, e.g., as available from Yuasa-Exide, among others. It will be appreciated that many of the above-described modifications to the components in subsystem 20 may also apply to the subsystem 100 components.

Operation of Electronic System

Under normal operating conditions the system power control networks of subsystems 20 and 100 operate in a similar manner to continuously supply power to the various operational components of electronic system 10, while monitoring their various components to ensure that a constant and reliable source of power is available to the system. For example, in subsystem 20, primary bus 52 is maintained at about +29 VDC by bulks 60, and regulators 82, 84 step down this voltage to different voltage levels required by other components of subsystem 20. Also, during normal operation, SPCN controller 50 constantly monitors power conditions in the network. Included within these duties is sending periodic requests (preferably about once a second) to power supply 70 to obtain the power supply battery terminal voltage, the power supply battery current, and the primary bus voltage therefrom.

As another part of the monitoring function, SPCN controller 50 controls power supply 70 to charge batteries 74 as necessary to maintain the batteries in a fully charged condition. Any known charging routines may be utilized to accomplish this function. For example, the batteries may be charged off of primary bus 52 by closing switches Q1, Q5 & Q6. Similarly, a low power or trickle charge may be performed off CPM bus 54 when the system is powered off, but AC is present and CPM bus 54 is up, by closing switch Q7.

Switch Q1 is enabled by SPCN controller 50 to close if the voltage of bus 52 falls below +26.5 VDC as detected by circuits in power supply 70. In the event of a power outage, e.g., due to loss of AC line power or failure of one or more bulk regulators in subsystem 20, the voltage of bus 52 will fall below +26.5 VDC, causing switch Q1 to close and connect batteries 74 to primary bus 52. When switch Q1 is closed, SPCN controller 50 detects the back-up power supply 70 is sourcing battery current to bus 52 through serial interface 56.

It has been found that a majority of power failures are typically restored within about 30 seconds. Therefore, SPCN controller 50 preferably waits a predetermined time period, preferably about 30 seconds, to see if power is restored within this time. During this time, SPCN controller 50 polls serial interface 56 to determine if power has been restored, which occurs when power supply 70 indicates that no current is being sourced from the batteries. If power is not restored, SPCN controller 50 then notifies the main processing system (functionally shown by block 80) of the power loss so that the system can complete critical operations and switch from the normal operational mode to a low power "sleep" or power saving mode. Once past the initial 30 second period, the process is irreversible. In the preferred embodiment, the conversion can take a maximum of about 90 seconds, resulting in an overall "conversion time" of about two minutes.

When the conversion routine is completed, SPCN controller 50 is notified to initiate a low power "sleep" or power saving mode for subsystem 20. This is performed by closing switch Q2 in power supply 70 to connect the battery to the CPM bus 54, then opening switch Q1 a predetermined period thereafter (preferably about one second) to disconnect power to primary bus 52. In this mode, the sole power draw on back-up power supply 70 is about a 7 W power drain on CPM bus 54 (vs. the 2400 W typical power draw during normal operation and during the conversion time). With satisfactory batteries (26 Amp-hour capacities for batteries 74, and 7 Amp-hours each for batteries internal to power supplies 170 and 172), all system batteries should be able to maintain power for this mode for at least two days if necessary at battery end-of-life.

Many of the components, hardware configurations, control algorithms, etc. for the system power control networks of system 10 are conventional in nature and in any event need not be discussed in greater detail for a complete understanding of the invention. Moreover, as many of these components, configurations and algorithms are specifically dependent upon the power requirements and functionality of a particular electronic system, it will be appreciated that various modifications may be made to the preferred embodiments consistent with the invention.

Battery Capacity Test

Another function of SPCN controllers 50 and 120 is to periodically test the batteries in power supplies 70, 170 and 172 to ensure that they have adequate capacity to power system 10 in the event of a power outage. As discussed above, in the preferred embodiment, the back-up power supplies must be able to supply full power to system 10 (e.g., about 200 to 2400 W) for at least two minutes, and must be able to power CPM buses 54 and 124 in a power saving mode (e.g., about 0.5 to 7.15 W) for at least two days. The battery capacity tests are preferably performed about once every three months, and only when all batteries in system 10 are fully charged.

FIGS. 2a–b illustrate a preferred battery capacity test routine 200, which is preferably implemented on both SPCN controllers 50 and 120 to test the individual subsystems separately. The operation of routine 200 in SPCN controller 50 will only be discussed herein, since it will be appreciated that a similar routine may execute on SPCN controller 120, although various voltages, amperage draws, test times, and other variables may be different because of the lower capacity of the batteries in supplies 170, 172. It should be noted that for subsystem 100, each back-up power supply's batteries are tested separately, with the other power supply's batteries being disabled during testing.

The battery capacity test executed by SPCN controller 50 preferably performs both high discharge and low discharge capacity tests, which are respectively illustrated as routines 210 and 230 in FIGS. 2a and 2b. As discussed above, batteries may have different high and low discharge capacities that may independently degrade over time. Thus, we have found that both capacities should be tested to ensure maximum system integrity.

FIG. 2a illustrates the high discharge capacity test routine 210 in greater detail. The primary purpose of this test is to determine if batteries 74 can handle the full load of system 10 for a conversion time necessary to complete critical operations and convert the system from a high power operational mode to low power "sleep" mode. This portion of the test performs a discharge of the batteries at a high discharge rate with the batteries supporting the full load of the system.

To ensure high discharge capacity, it has been found that it is not necessary to discharge the batteries for a time period equivalent to the conversion time. For example, in the preferred embodiment, empirical testing of the preferred batteries has determined that about 40 seconds is a sufficient test to ensure the ability of the batteries to handle the full system load for the two minute conversion time. Discharge for the full conversion time is not preferred because the safety net provided by bulks 60 running at the reduced testing level of about +21.5 VDC will not permit a discharge for the full time period before the bulks begin sharing a portion of the system load with the batteries.

Once the battery voltage is low enough to engage the +21.5 VDC safety net, the system load is shared by the battery and bulks. If the complete system load is not supplied by the batteries, it is not conclusive that the batteries could supply the system load without a safety net. Therefore, the batteries can only be high power discharge tested with the energy available prior to engagement with the safety net voltage.

Turning to high discharge capacity test routine 210, the first step in block 212 is for controller 50 to lower the outputs of bulks 60 to a reduced testing voltage which is preferably a minimum regulator voltage, which is about +21.5 VDC in the preferred embodiment. In addition, since Q1 is enabled by SPCN controller 50, switch Q1 of power supply 70 is automatically closed to connect batteries 74 to primary bus 52. When the output voltage of the batteries exceeds the minimum regulator voltage (as is the case with fully charged batteries), the batteries begin to discharge to the bus across diode D1 and handle the system load. With bulks 60 at the minimum regulator voltage, however, a "safety net" is provided, as the bulks may immediately handle the system load should power supply 70 fail to adequately power the bus. As a result, batteries 74 are tested using the full system load without compromising system integrity.

Next, block 214 initializes a discharge variable and a high power time variable. The discharge variable, which is initialized to null, is a running counter of the amount of battery capacity used or discharged in the test, preferably in units of Amp-seconds. The high power time variable is a time value utilized by a timer in the controller, and is related to the amount of time to execute the high discharge capacity test, which is set to about 40 seconds in the preferred embodiment.

Next, a timing loop is executed in blocks 215–218 to discharge the battery for the high power time while supporting the full system load. Block 215 prematurely terminates the loop if the bus voltage sensed by supply 70 drops below an AC loss kickout level (preferably about +19.5 VDC), which indicates a power outage during the test loop. In this case, it is necessary to abort the test because the batteries are required to handle the power outage condition in the manner described above.

Otherwise, block 216 checks if the timer has expired, and if not, executes block 218 to accumulate the discharged capacity during the high rate discharge and return to block 215. The number of accumulated amp-seconds may be measured, for example, by polling supply 70 periodically to sample the battery current output, then integrating or summing over time.

Once the high power time has elapsed and the timer expires, block 216 passes control to block 220 to test the battery voltage output against a minimum test voltage value, which is related to the minimum voltage at which the batteries are guaranteed to supply the necessary power during the conversion time. In the preferred embodiment, the minimum test voltage has been empirically determined to be about +22.5 VDC (and about +22.0 VDC for power supplies 170, 172), which is in part dictated by use of the "safety net", since below this level the bulks begin to share some of the load and corrupt test results.

If the battery voltage output is less than the minimum test voltage constant, then the batteries fail the high discharge capacity test. In this case, block 222 resets the bulks to their full operating voltage, and the test returns with a message to replace the battery.

If, however, the battery voltage output is at least the minimum test voltage, then control passes to block 232 shown in FIG. 2b to perform low capacity discharge test routine 230. The primary purpose of this routine is to ensure that the batteries can maintain the system in a low power "sleep" or power saving mode for a sufficient time for the customer or user to fix the system or otherwise restore power. As discussed above, the batteries preferably can power the system in the low power mode for at least two days after the conversion to low power.

Routine 230 basically operates by sourcing additional capacity from the batteries to determine if the batteries can supply a total capacity at least equal to the end-of-life (EOL) capacity rating for the batteries from a fully charged condition. It has been found that once batteries are no longer capable of supplying an amount of power equal to their EOL capacity, their usability quickly diminishes. In the preferred embodiment, the EOL capacity of a battery is about ½ of its rated capacity. Thus, for batteries 74 having a rated capacity of 26 Amp-hours each, the EOL capacity for the power supply with both batteries 74 is 13 Amp-hours. Other batteries may have other EOL capacities, e.g., depending upon their efficiency.

It will be appreciated that capacity is discharged from the batteries during both routines in battery capacity test routine 200. Thus, the total capacity sourced from the batteries during the high capacity test routine (which is accumulated in the discharge variable) is also relevant to an EOL capacity measurement. The purpose of routine 230 is to attempt to source additional capacity from the batteries until the EOL capacity is exceeded, if possible.

Low discharge capacity test 230 preferably includes two portions: a first, fast discharge routine 231 and a second, low power or slow discharge routine 241. In the alternative, fast discharge routine 231 may be omitted, with the sole sourcing in test 230 being a slow discharge in routine 241. However, the purpose of the fast discharge routine is to speed up the test time. It will be appreciated that capacity is merely a product of amperage and time, so a higher discharge amperage reduces the time required to source a given capacity. In fact, in the preferred embodiment, the entire battery capacity test typically requires 2–2.5 hours to run. It is estimated, however, that without routine 231, the test time would increase to approximately 8 hours or more.

Fast discharge routine 231 includes a primary loop in blocks 232–236, which essentially implements a full power discharge of the batteries while they are supporting the system load, all the while accumulating capacity in the discharge variable in block 236. This loop generally executes until block 234 determines that the battery voltage output has dropped below the minimum test voltage (preferably +22.5 VDC) and that the battery current output has dropped below a minimum test amperage value.

The minimum test amperage value (which is about 10 Amps in the preferred embodiment) is preferably related to the amount of load that the bulks 60 can handle at the minimum regulator voltage output level without excessive thermal stress. In particular, as the battery voltage output drops near or below the minimum test voltage, the bulks begin to share part of the system load. However, there is a limited current which the bulks can handle at this reduced output. The minimum test amperage is equivalent to the total current drain from the system load less the maximum current capable of being supplied by the bulks at the reduced testing voltage without excessive thermal stress.

The loop of blocks 232–236 may also be terminated by block 232 if the bus voltage sensed by supply 70 drops below the AC loss kickout level, similar to block 215 discussed above. Block 232 is particularly beneficial in this loop because if the bulks suddenly stopped working, the battery current output would remain above the minimum test amperage for an excessive time period since the bulks would never begin sharing the system load.

Returning to block 234, upon detection of the battery current and voltage outputs falling below the predetermined levels, the amount of capacity discharged from the batteries and accumulated in the discharge variable is compared to the EOL capacity of the batteries in block 238. If the capacity discharged is at least the EOL capacity, then the batteries satisfy the low discharge capacity test. In that case, block 240 resets the bulks and the routine returns with a message that the batteries are satisfactory.

On the other hand, if the capacity discharged is still less than the EOL capacity, additional discharging is performed at a low discharge rate in slow discharge routine 241. In block 242 of this routine, the bulks are reset to their operating voltage to again supply power to the primary bus. Next, in block 244, a low power time constant is calculated, preferably from the equation:

$$\text{Low Power Time} = \frac{EOL \text{ Capacity} - \text{Discharge}}{\text{Power Saving Mode Amps}}$$

The low power time constant is essentially the amount of time required to reach the EOL capacity at the low discharge rate, specifically sourcing from the batteries at a power saving mode amps output. Preferably, the power saving mode amps output is about 2.0 Amps (or 0.5 Amps for the batteries in supplies 170, 172).

Next, in block 246, the charger of back-up power supply 70 is converted to operate as a discharger to source the power saving mode amps from the batteries to the bus. In the preferred embodiment, this is performed by closing switches Q3 and Q4.

Then, a timing loop including blocks 248–250 discharges at the low discharge rate until either a timer set to the calculated low power time value expires or until the battery voltage output falls below a low voltage cutoff value. The low voltage cutoff value is related to the minimum voltage output by the batteries before the batteries are fully discharged (+20.0 VDC in the preferred embodiment). If the timer expires indicating the low power time period has elapsed, the discharged capacity from the batteries has exceeded the EOL capacity, indicating that the batteries have passed the test. Thus, block 248 terminates the loop and returns a message indicating the passed test. However, if the battery voltage output falls below the low voltage cutoff value before the low power time period is reached, the batteries do not pass the test and must be replaced, so block 250 exits the loop and returns a message indicating the test failure.

Thus, the invention provides significant advantages in terms of reduced testing time while occupying little system resources, as well as reliability due to the "safety net" operation of the regulators or bulks, thereby maintaining system integrity. As various modifications may be made to the preferred embodiments without departing from the spirit and scope of the invention, the invention therefore lies in the claims hereinafter appended.

What is claimed is:

1. A method of testing a battery in a back-up power supply of an electronic system of the type operating in a first, operational mode and a second, power saving mode, the electronic system having a primary power source for providing power to the electronic system, the method comprising the steps of:

(a) testing a high discharge capacity for the battery to determine whether the battery is capable of supplying sufficient power to the electronic system during a conversion time in which the electronic system converts from the operational mode to the power saving mode; and (b) testing a low discharge capacity for the battery to determine whether the battery is capable of supplying sufficient power to the electronic system during the power saving mode.

2. The method of claim 1, wherein the high discharge capacity testing step includes the steps of:

(a) discharging the battery at a high discharge rate for a high power time;

(b) after discharging the battery for the high power time, determining a test fail if a battery voltage output of the battery is less than a minimum test voltage, wherein the high power time and the minimum test voltage are selected to ensure the capability of the battery to supply sufficient power to the electronic system during the conversion time.

3. The method of claim 2, wherein the discharging step includes the step of switching the system load of the computer system to the back-up power supply by lowering the output voltage of a regulator in the primary power source from an operating voltage to a testing voltage, and wherein the test fail determining step includes the step of resetting the regulator upon completion of the high discharge capacity testing step.

4. The method of claim 3, wherein the switching step comprises the step of lowering the output of the regulator to a minimum regulator voltage.

5. The method of claim 3, further comprising the step of measuring a discharged capacity of the battery when the battery is discharging, wherein the discharged capacity relates to an amount of capacity discharged from the battery while testing.

6. The method of claim 5, wherein the low discharge capacity testing step includes the steps of:

(a) discharging an end-of-life capacity from the battery;

(b) determining a test fail if the battery voltage output of the battery is less than a low voltage cutoff prior to discharging the end-of-life capacity from the battery, wherein the low voltage cutoff is related to a minimum voltage output from the battery before the battery is fully discharged; and (c) determining a test pass if the end-of-life capacity is discharged from the battery before the battery voltage output of the battery falls below the low voltage cutoff.

7. The method of claim 6, wherein the end-of-life capacity discharging step includes the steps of:

(a) calculating a low power time related to an amount of time necessary to discharge, at a low discharge rate, the end-of-life capacity from the battery less the discharged capacity previously discharged from the battery; and (b) discharging the battery at the low discharge rate for the low power time.

8. The method of claim 7, wherein the step of discharging the battery at the low discharge rate includes the steps of resetting the regulator and converting a battery charger in the back-up power supply to a battery discharger.

9. The method of claim 7, wherein the end-of-life capacity discharging step further includes the steps of:

(a) before discharging the battery at the low discharge rate, discharging the battery at a high discharge rate until the battery voltage output of the battery falls below the minimum test voltage and a battery current output of the battery falls below a minimum test amperage; and (b) determining a test pass and aborting the step of discharging the battery at the low discharge rate if the discharged capacity at the completion of discharging the battery at the high discharge rate is at least the end-of-life capacity.

10. The method of claim 9, wherein the end-of-life capacity discharging step further includes the step of aborting the low discharge capacity testing step if a power outage is detected while discharging the battery at the high discharge rate, wherein the power outage is detected when a power bus voltage in the electronic system falls below a predetermined voltage.

11. The method of claim 9, wherein the end-of-life capacity is about one half of a rated capacity for the battery.

12. The method of claim 1, wherein the electronic system is a minicomputer including means for completing critical tasks during the conversion time in the event of a power outage.

13. An electronic system of the type operating in a first, operational mode and a second, power saving mode, comprising:

(a) a primary power source for providing power over a system bus;

(b) a back-up power supply coupled to the system bus for providing power over the system bus when the primary power source is not operating, the back-up power supply including a battery; and (c) a controller for testing the battery, the controller including:

(i) high discharge capacity testing means for testing a high discharge capacity of the battery to determine whether the battery is capable of supplying sufficient power to the electronic system during a conversion time in which the electronic system converts from the operational mode to the power saving mode; and (ii) low discharge capacity testing means for testing a low discharge capacity of the battery to determine whether the battery is capable of supplying sufficient power to the electronic system during the power saving mode.

14. The electronic system of claim 13, wherein the electronic system is a minicomputer including:

(a) a primary power bus and a continuously powered memory bus, each coupled to the primary power source and the back-up power supply; and (b) converting means for converting the minicomputer from the operational mode to the power saving mode during the conversion time in the event of a power outage, the converting means including means for completing critical tasks during the conversion time.

15. The electronic system of claim 13, wherein the primary power source includes a regulator which is switchable to operate at an operating voltage and a testing voltage, wherein the testing voltage is less than the operating voltage, and wherein the high discharge capacity testing means includes switching means for switching the system load for the electronic system to the battery by activating the regulator to output at the testing voltage.

16. The electronic system of claim 15, wherein the high discharge capacity testing means includes:

(a) timing means for controlling the switching means to switch the system load to the battery for a high power time; and (b) means for indicating a test fail if a battery voltage output of the battery is less than a minimum test voltage, wherein the high power time and the minimum test voltage are selected to ensure the capability of the battery to supply sufficient power to the electronic system during the conversion time.

17. The electronic system of claim 16, wherein the controller further comprises accumulating means for measuring a discharged capacity of the battery when the battery is discharging, and wherein the low discharge capacity testing means includes:

(a) fast discharge means for controlling the switching means to switch the system load to the battery until the battery voltage output of the battery falls below the minimum test voltage and a battery current output of the battery falls below a minimum test amperage, the fast discharge means indicating a test pass if the discharged capacity measured by the accumulating means is at least an end-of-life capacity;

(b) slow discharge means for converting the back-up power supply to a battery discharger to source current from the battery at a low discharge rate for a low power time, wherein the low power time is related to an amount of time necessary to discharge, at the low discharge rate, the end-of-life capacity from the battery less the discharged capacity previously discharged from the battery, the slow discharge means indicating a test pass if the low power time passes before the battery voltage output of the battery falls below a low voltage cutoff, and the slow discharge means indicating a test fail if the battery voltage output of the battery is less than the low voltage cutoff prior to expiration of the low power time.

18. The electronic system of claim 17, wherein the fast discharge means aborts the low discharge capacity testing means in the event of a power outage.

19. The electronic system of claim 17, wherein the high power time is about 40 seconds and the conversion time is about two minutes.

20. A program storage device readable by an electronic system of the type operating in a first, operational mode and a second, power saving mode, the electronic system having a primary power source for providing power to the electronic system, the program storage device tangibly embodying a program of instructions executable by the electronic system to perform a method of testing a battery in a back-up power supply coupled to the electronic system, the method comprising the steps of:

(a) testing a high discharge capacity for the battery to determine whether the battery is capable of supplying sufficient power to the electronic system during a conversion time in which the electronic system converts from the operational mode to the power saving mode; and (b) testing a low discharge capacity for the battery to determine whether the battery is capable of supplying sufficient power to the electronic system during the power saving mode.

* * * * *